United States Patent [19]
Takahashi

[11] Patent Number: 6,106,628
[45] Date of Patent: Aug. 22, 2000

[54] HEATER UNIT FOR CHEMICAL VAPOR DEPOSITION SYSTEMS

[75] Inventor: Ichiro Takahashi, Kamakura, Japan

[73] Assignee: Japan Process Engineering Ltd., Osaka, Japan

[21] Appl. No.: 09/280,891

[22] Filed: Mar. 29, 1999

[51] Int. Cl.$^7$ .................................................. C23C 16/00
[52] U.S. Cl. ........................................ 118/725; 118/728
[58] Field of Search ..................................... 118/724, 725

[56] References Cited

U.S. PATENT DOCUMENTS

| | | | |
|---|---|---|---|
| 5,038,711 | 8/1991 | Dan et al. ................................ | 118/725 |
| 5,427,620 | 6/1995 | deBoer et al. . | |
| 5,554,224 | 9/1996 | Foltyn ..................................... | 118/725 |
| 5,679,405 | 10/1997 | Thomas et al. . | |
| 5,688,331 | 11/1997 | Arunga et al. ........................... | 118/725 |

Primary Examiner—Shrive Beck
Assistant Examiner—Sylvia R MacArthur
Attorney, Agent, or Firm—Marshall & Melhorn

[57] ABSTRACT

In a chemical vapor deposition system, a pair of turntables are vertically disposed opposite to each other, and a plurality of wafers to be processed are arranged circumferentially on opposing surfaces of the turntables. Heater units are arranged behind the turntables, each of the heater units comprising a plurality of concentric grooves defined in a surface of a base behind the corresponding one of the turntables, a heating element received in each of the grooves, a cover plate placed over the grooves so as to seal the interior of the grooves from the exterior of the grooves, and a conduit connected to a vacuum pump for maintaining a higher level of vacuum in the grooves than outside cover plate. Thus, the interior of the grooves is effectively sealed, and intrusion of contaminants into the heater unit can be avoided.

5 Claims, 1 Drawing Sheet

HEATER UNIT FOR CHEMICAL VAPOR DEPOSITION SYSTEMS

TECHNICAL FIELD

The present invention relates to a heater unit for chemical vapor deposition systems, and in particular to a such heater unit which is free from contamination.

BACKGROUND OF THE INVENTION

Chemical vapor deposition (CVD) is commonly used for forming thin layers of material known as films over an integrated circuit substrate and other surfaces. The substrate commonly known as a wafer is heated in a reaction chamber, and is exposed to material gases introduced into the chamber. As a result of thermal decomposition and/or reaction of the material gases, a film such as a gallium arsenide compound is formed on the surface of the wafer.

In a system for such a CVD process, as a result of contact with the material gas, unnecessary byproducts such as arsenide tend to be deposited on various surfaces such as the wall surfaces provided opposite to the susceptors for the wafer to be processed for controlling the flow of the material gas. In particular, heater units for heating the wafers to be processed tend to be heavily contaminated by such material deposition which is known to be detrimental to satisfactory operation of the heater units.

BRIEF SUMMARY OF THE INVENTION

In view of such problems of the prior art, a primary object of the present invention is to provide a heater unit for chemical vapor deposition systems which is free from contamination.

A second object of the present invention is to provide a heater unit for chemical vapor deposition systems which is both efficient in operation and simple in structure.

A third object of the present invention is to provide a chemical vapor deposition system which is capable of uniformly heating the wafers to be processed.

According to the present invention, these and other objects can be accomplished by providing a heater unit for chemical vapor deposition systems, comprising: a base supporting a susceptor which has a front surface for retaining wafers; a groove formed in a surface of the base opposing a backside of the susceptor; a heating element received in the groove; a cover plate placed over the groove; and a conduit communicating the groove to a vacuum pump for maintaining the interior of the groove at a higher level of vacuum than the exterior of the cover plate.

Thus, the cover plate is pressed against the surface of the base by the pressure differential acting upon the cover plate, and the interior of the groove is favorably sealed off from intrusion of contaminants. In particular, when the heater unit comprises a plurality of grooves, and the cover plate is supported at a plurality of points by land regions defined between the heater grooves, the cover plate is protected from excessive stress which may be otherwise applied to the cover plate.

According to a preferred embodiment of the present invention, the susceptors are supported by a turntable, and the grooves may comprise a plurality of concentric grooves defined around a center of rotation of the turntable. This arrangement is beneficial in optimizing the utilization of the available space in the reaction chamber. In this case, a pair of sealing arrangements preferably extend along an outer periphery and inner periphery of the cover plate relative to the base so as to simplify the maintenance of a high level of vacuum in the grooves. Typically, the cover plate is made of quartz glass which has a high transmissivity for infrared radiation, and favorable mechanical properties.

BRIEF DESCRIPTION OF THE DRAWINGS

Now the present invention is described in the following with reference to the appended drawing, in which.

DETAILED DESCRIPTION OF THE PREFERRED EMBODIMENTS

Figure 1:
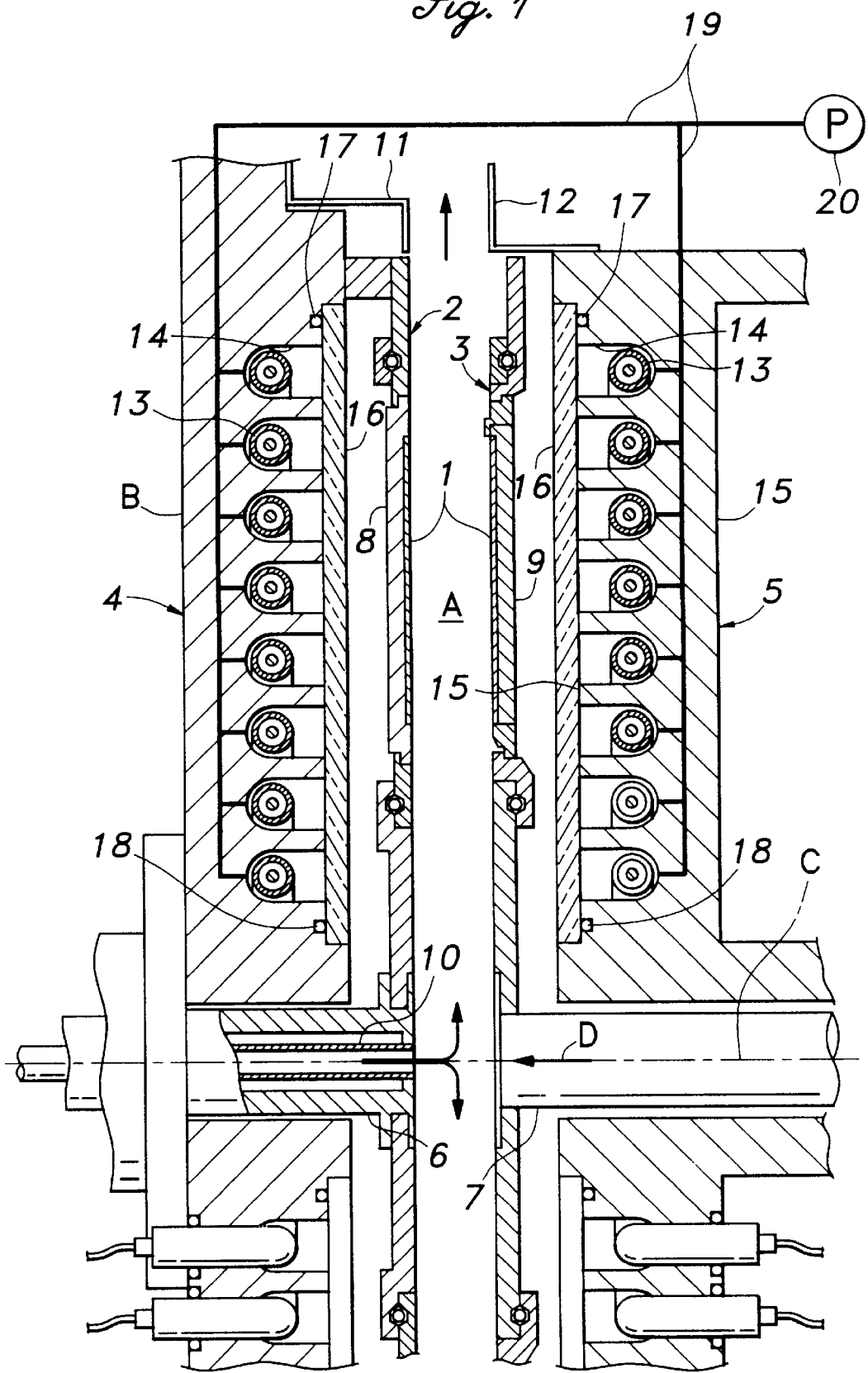
FIG. 1 is a vertical sectional view of a reaction chamber of a CVD system embodying the present invention.

Referring to FIG. 1, the illustrated CVD system embodying the present invention comprises a pair of turntables 2 and 3 which are rotatably supported by a fixed base B via respective hollow rotary shafts 6 and 7. The entire assembly is received in a reaction chamber suitable for carrying out CVD processes. The rotary shafts 5 and 6 are aligned with each other on a common center line of rotation C, and the turntables 2 and 3 are attached to the opposing free ends of the rotary shafts 6 and 7. The turntables are thus placed opposite to each other defining a prescribed gap A between them. The base B is further provided with a pair of heater units 4 and 5 which are placed opposite to the other surfaces of the turntables 2 and 3. The turntables 2 and 3, the rotary shafts 6 and 7 and the heater units 4 and 5 are thus placed symmetrically around the center line of rotation C.

Preferably, the center line of rotation C is disposed horizontally, and the surfaces of the turntables are therefore disposed vertically. The rotary shafts 6 and 7 are adapted to be turned by a motor unit not shown in the drawing. The turntables 2 and 3 comprise annular susceptors 8 and 9 which are disposed concentrically around the center line of rotation C, and are made of chemically stable material such as carbon. A plurality of wafers 1 are retained on the opposing surfaces of these susceptors 8 and 9, and are arranged circumferentially or concentrically on each susceptor surface.

One of the rotary shafts 6 is internally and coaxially fitted with a conduit 10 for introducing material gas into the gap A between the two turntables 2 and 3. The material gas uniformly flows in radially outward direction, and undergoes a chemical reaction over the surfaces of the wafers 1, thereby depositing a desired film over the surfaces of the wafers 1. The exhaust gas which is produced from the chemical reaction is expelled from an exit defined by a pair of guide members 11 and 12 attached to the heater units 4 and 5 along the outer periphery of the gap A between the two turntables 2 and 3, and is removed out of the reaction chamber by means not shown in the drawing.

As the reaction gas flows out of the opening of the conduit 10 radially in a uniform manner, it is heated by the heater units 4 and 5 and tends to rise vertically. Because of the rotation of the turntables 2 and 3, the wafers 1 move up and down and are uniformly exposed to the material gas despite the tendency of the material gas to move upward. By turning the turntables 2 and 3 in mutually opposite directions, the wafers 1 can be even more uniformly exposed to the material gas.

The heater units 4 and 5 each comprise a plurality of resistive annular heaters 13, annular grooves 14 formed in the base B facing the backside of the corresponding turntable for receiving the corresponding heaters, and a cover plate 16 placed over the grooves 14. The grooves 14 are concentrically disposed around the center line of rotation C, and are therefore given with different diameters depending on the distance from the center line of rotation C. The heaters 13 are adapted to the dimensions of these grooves 14, and each consist of an infrared heater or an infrared lamp having a required capacity for heating the gap A to a prescribed temperature.

The wall surface of each of the grooves 14 is finished as a mirror surface so as to reflect backward thermal radiation to forward. The cover plate 16 placed in front of the heaters 13 consists of quartz glass which transmits thermal radiation from the heaters 13 and is provided with required mechanical strength and properties. The base B is provided with seal grooves fitted with sealing members 17 along inner and outer peripheries of the cover plate 16. The bottom of each heater groove 14 communicates with a vacuum pump 20 via a conduit 19 so as to keep the interior of each heater groove 14 to a higher level of vacuum than the remaining part of the reaction chamber. For instance, when the pressure inside the reaction chamber is $10^{-2}$ Torr, the pressure inside each heater groove may be $10^{-3}$ Torr. The pressure difference pushes the cover plate 16 onto the heater base, and this ensures the interior of each heater groove 14 to remain at the proper vacuum level. Thus, the intrusion of the material gas into the heater grooves 14 and the resulting deposition of material in the heater grooves 14 can be effectively avoided. The cover plate 16 is subjected to the stress due to the pressure difference. However, the cover plate 16 is supported at a plurality of points by the land regions 15 defined in the base B between the heater grooves 14.

The size of the gap A can influence the velocity of the material gas, and thus the final result of the CVD process. By allowing the size of the gap A to be adjusted, for instance by moving one of the rotary shafts 7 in the axial direction as indicated by the arrow D, it is possible to finely adjust the conditions of the CVD process.

According to this arrangement, the turntables opposing each serve as flow control surfaces which are mostly covered by wafers so that the extraneous deposition of material on the walls of the reaction chamber can be minimized. This is advantageous in terms of both easing the work required for maintaining the CVD system, and reducing the waste of the material gas. Also, the placement of the heaters near the backside of the wafers results in a uniform temperature distribution which is beneficial in maintaining the quality of the final products.

This arrangement additionally allows an efficient utilization of the space inside the reaction chamber, and can thereby improve the productivity of the CVD system.

Although the present invention has been described in terms of a preferred embodiment thereof, it is obvious to a person skilled in the art that various alterations and modifications are possible without departing from the scope of the present invention which is set forth in the appended claims.

What is claimed is:

1. A heater unit for chemical vapor deposition systems, comprising:

a base supporting a susceptor which has a front surface for retaining wafers;

a groove formed in a surface of said base opposing a backside of said susceptor;

a heating element received in said groove;

a cover plate placed over said groove; and a conduit communicating said groove to a vacuum pump for maintaining the interior of said groove at a higher level of vacuum than the exterior of said cover plate.

2. A heater unit according to claim 1, wherein said heater unit comprises a plurality of grooves, and said cover plate is supported at a plurality of points by land regions defined between said heater grooves.

3. A heater unit according to claim 1, wherein said susceptors are supported by a turntable, and said grooves comprise a plurality of concentric grooves defined around a center of rotation of said turntable.

4. A heater unit according to claim 3, further comprising a pair of sealing arrangements extending along an outer periphery and inner periphery of said cover plate relative to said base.

5. A heater unit according to claim 1, wherein said cover plate is made of quartz glass.

* * * * *